(12) United States Patent  
Westman et al.

(10) Patent No.: US 7,896,659 B1  
(45) Date of Patent: Mar. 1, 2011

(54) MODULAR CONNECTOR SYSTEM

(75) Inventors: John Eugene Westman, Harrisburg, PA (US); Brian Keith McMaster, Jr., Mechanicsburg, PA (US); Michael Warren Fogg, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/555,403

(22) Filed: Sep. 8, 2009

(51) Int. Cl.
*H01R 13/60* (2006.01)

(52) U.S. Cl. ................. 439/75; 439/541.5; 439/607.26; 439/607.25; 439/108

(58) Field of Classification Search .................. 439/75, 439/541.5, 607.26, 607.25, 108, 607.21
See application file for complete search history.

(56) References Cited

U.S. PATENT DOCUMENTS

| | | | |
|---|---|---|---|
| 5,460,531 A * | 10/1995 | Vivio ........................... 439/70 |
| 5,825,630 A * | 10/1998 | Taylor et al. ................. 361/790 |
| 6,350,134 B1 | 2/2002 | Fogg et al. |
| 6,474,999 B1 * | 11/2002 | Givens et al. .............. 439/76.1 |
| 6,540,564 B1 * | 4/2003 | Ko .............................. 439/676 |
| 6,910,917 B2 * | 6/2005 | Chen ........................ 439/541.5 |
| 7,070,446 B2 | 7/2006 | Henry et al. |
| 7,708,569 B2 * | 5/2010 | Sercu et al. .................. 439/108 |
| 7,717,749 B2 * | 5/2010 | Chen et al. ............. 439/620.22 |
| 7,748,997 B2 | 7/2010 | Hamner et al. |
| 7,748,998 B2 | 7/2010 | Fogg |
| 7,753,731 B2 * | 7/2010 | Cohen et al. ........... 439/607.09 |
| 2005/0106939 A1 * | 5/2005 | Zhang et al. ................. 439/607 |
| 2005/0255746 A1 * | 11/2005 | Hyland ..................... 439/541.5 |

* cited by examiner

*Primary Examiner*—Gary F. Paumen

(57) ABSTRACT

A connector assembly includes a subsidiary circuit board, connectors, and an interposer assembly. The subsidiary circuit board includes opposite sides. The connectors are mounted to the opposite sides of the subsidiary circuit board and are electrically coupled with the subsidiary circuit board. The connectors are configured to mate with mating connectors. The interposer assembly is joined with the subsidiary circuit board. The interposer assembly includes a dielectric housing and elongated contacts that extend between opposite outer ends along a vertical axis and are held by the housing. The interposer assembly mates with the subsidiary circuit board and is configured to mate with a main circuit board such that the outer ends of the contacts electrically couple the connectors mounted to the subsidiary circuit board with the main circuit board.

22 Claims, 6 Drawing Sheets

US 7,896,659 B1

MODULAR CONNECTOR SYSTEM

BACKGROUND OF THE INVENTION

The invention relates generally to electrical connectors and, more particularly, to a connector system that is capable of mating with several mating connectors.

Known connector systems include several connectors within a connector cage. The connector cage typically is a conductive body that is electrically coupled with an electric ground reference. The connector cage may include ports that are shaped to receive mating connectors. The connectors located in the connector cage are located within the ports such that these connectors mate with the mating connectors when the mating connectors are inserted into the ports. The connector cage may shield the connectors from electromagnetic interference.

Some of these known connector systems provide two or more of the connectors in the connector cage in a vertically stacked arrangement. For example, a pair of the connectors may be disposed above and below one another with the lower connector mounted to a circuit board and the upper connector coupled with the lower connector. By way of example only, the upper and lower connectors may be included in a single, unitary common housing with separate mating interfaces that mate with the mating connectors. The common housing of the connectors can be mounted to a circuit board. The connector cage of the system also may be mounted to the same circuit board.

Typically, the connectors in the cage include contacts that mate with and electrically couple with corresponding contacts of the mating connectors. The contacts of the connectors in the cage may extend from the mating interfaces of the connectors to the circuit board to which the housing of the connectors is mounted. Alternatively, the contacts may be electrically coupled with the circuit board via one or more additional conductive components. In either case, conductive signal paths for the contacts may extend from the mating interfaces of the connectors to the circuit board to electrically couple the mating connectors with the circuit board when the mating connectors mate with the connectors in the connector cage.

The signal paths for the contacts in the upper connector of the connector cage may be significantly longer than the signal paths for the contacts in the lower connector. For example, the distances that data signals must travel through the connectors to the circuit board may be greater for the upper connector than for the lower connector. In connector systems where relatively high data rates are used to communicate data using the connectors, the increased distance that the signals must pass may increase cross-talk in the signals.

A need exists for connector systems that include multiple connectors capable of relatively high speed data communication while reducing cross-talk among or between contacts or signal paths associated with the connectors.

BRIEF DESCRIPTION OF THE INVENTION

In one embodiment, a connector assembly is provided. The connector assembly includes a subsidiary circuit board, connectors, and an interposer assembly. The subsidiary circuit board includes opposite sides. The connectors are mounted to the opposite sides of the subsidiary circuit board and are electrically coupled with the subsidiary circuit board. The connectors are configured to mate with mating connectors. The interposer assembly is joined with the subsidiary circuit board. The interposer assembly includes a dielectric housing and elongated contacts that extend between opposite outer ends along a vertical axis and are held by the housing. The interposer assembly mates with the subsidiary circuit board and is configured to mate with a main circuit board such that the outer ends of the contacts electrically couple the connectors mounted to the subsidiary circuit board with the main circuit board.

In another embodiment, another connector assembly is provided. The connector assembly includes a connector cage, a subsidiary circuit board, a connector, an interposer assembly, and a push block. The connector cage includes a port that is configured to receive a mating connector into the connector cage. The connector cage is adapted to be mounted to a main circuit board. The subsidiary circuit board is disposed within the connector cage between the ports. The connector is mounted to and electrically coupled with the subsidiary circuit board. The connector is disposed within the port of the connector cage and is configured to mate with the mating connector to electrically couple the mating connector with the subsidiary circuit board. The interposer assembly is mounted to the subsidiary circuit board and is configured to mate with the main circuit board. The interposer assembly includes contacts that are configured to mate with and electrically couple the subsidiary circuit board with the main circuit board. The push block is disposed between the subsidiary circuit board and the connector cage. The push block receives a loading force that is applied to the connector cage and transfers the loading force to the interposer assembly to mate the interposer assembly with the main circuit board.

DETAILED DESCRIPTION OF THE INVENTION

Figure 1:
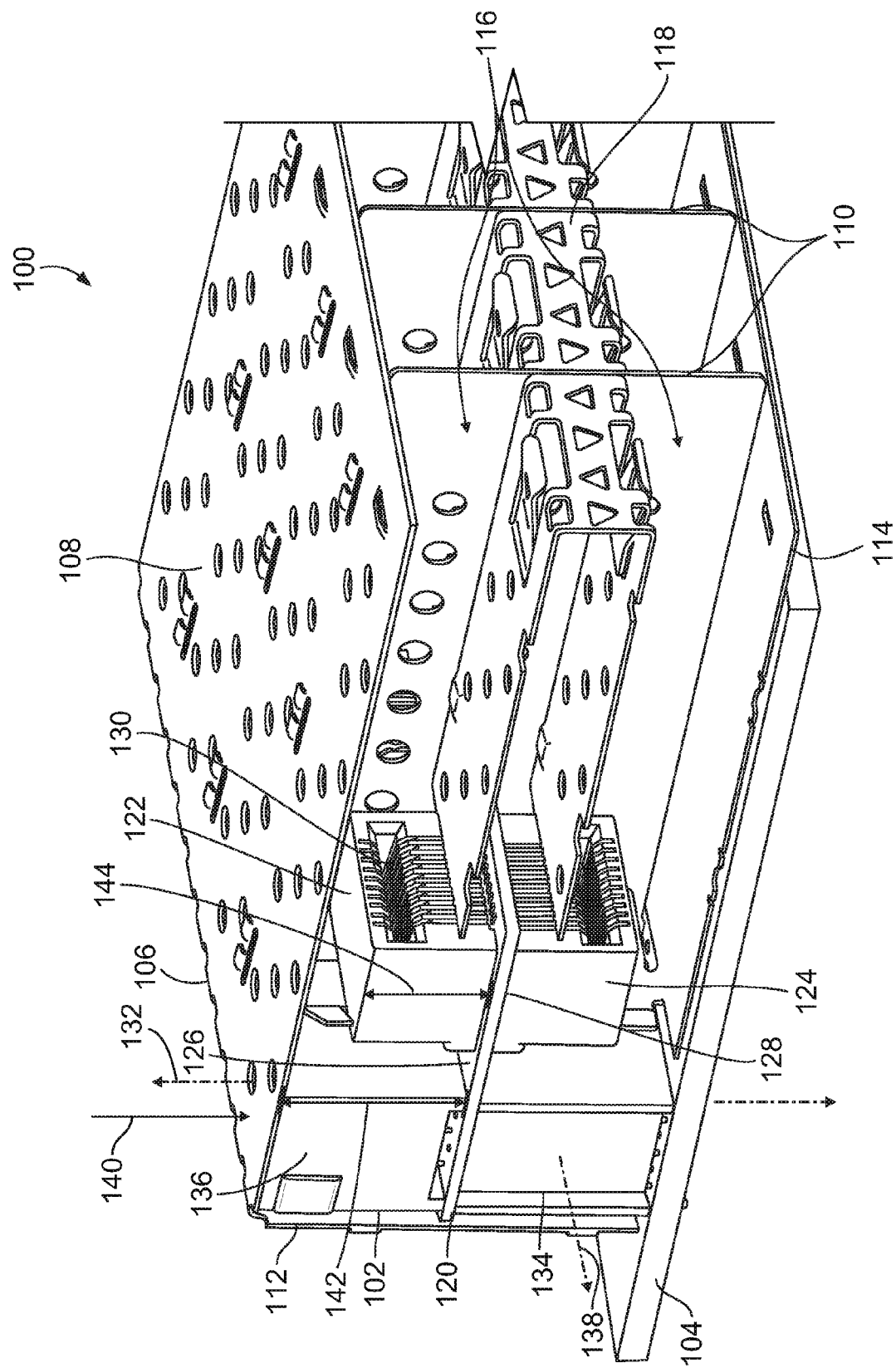
FIG. 1 is a partial cut-away view of a connector cage system in accordance with one embodiment of the present disclosure.
Figure 2:
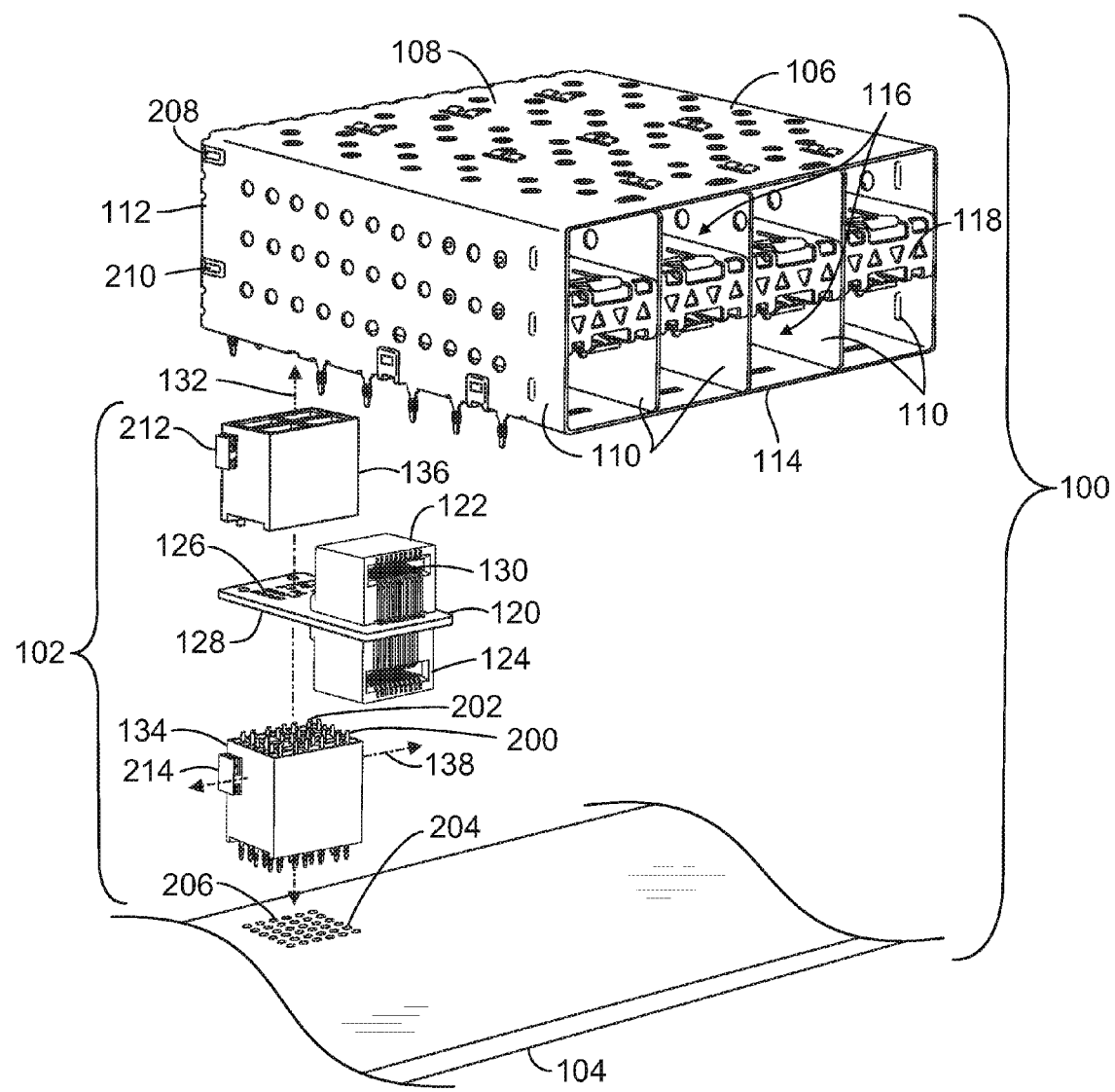
FIG. 2 is an exploded view of the connector cage system shown in FIG. 1 in accordance with one embodiment of the present disclosure.

FIG. 1 is a partial cut-away view of a modular connector system 100 in accordance with one embodiment of the present disclosure. FIG. 2 is an exploded view of the modular connector system 100 in accordance with one embodiment of the present disclosure. The system 100 includes a connector assembly 102 mounted to a main circuit board 104 and disposed within a connector cage 106. The connector cage 106 may be mounted to the main circuit board 104 to electrically couple the connector cage 106 with an electric ground reference of the main circuit board 104. The connector cage 106 may shield the connector assembly 102 from electromagnetic interference by being joined to the electric ground reference of the main circuit board 104.

The connector cage 106 is a conductive body that includes a top wall 108, several opposing side walls 110, a rear wall 112, and a bottom wall 114. A dividing or separator plate 118 is disposed between adjacent pairs of the side walls 110 to form upper and lower ports 116. One or more of the side walls 110 may include retention slots 208, 210 (shown in FIG. 2). The retention slots 208, 210 engage tabs 212, 214 on the connector assembly 102 to secure the connector assembly 102 to the connector cage 106. As shown in FIG. 1, the connector cage 106 includes multiple ports 116 that are formed by the walls 108-114 and plates 118. The ports 116 receive mating connectors (not shown) that mate with the connector assembly 102 to communicate data and/or power therebetween. By way of non-limiting example only, the ports 116 may have dimensions that are sized to receive a small form-factor pluggable connector or transceiver that mates with the connector assembly 102.

The connector assembly 102 includes a subsidiary circuit board 120 to which two connectors 122, 124 are mounted. By way of non-limiting example only, the connectors 122, 124 may be mounted to surfaces of the subsidiary circuit board 120 or through-hole mounted to the subsidiary circuit board 120. The connectors 122, 124 are shown in a stacked arrangement with one connector 122 located above the other connector 124 along a vertical axis 132 of the connector assembly 102. For example, the connectors 122, 124 are stacked above one another in groups or pairs in the illustrated embodiment. Such an embodiment may be referred to as a vertically stacked modular connector assembly. Alternatively, the connectors 122, 124 may be mounted side-by-side along a lateral axis 138 of the connector assembly 102. The connectors 122, 124 are electrically coupled with the subsidiary circuit board 120. For example, the connectors 122, 124 may include contacts 130 that are electrically joined with conductive traces (not shown) extending along and/or through the subsidiary circuit board 120. The number of connectors 122, 124 shown mounted to the subsidiary circuit board 120 in FIG. 1 is merely an example. A different number of the connectors 122, 124 may be provided. For example, only a single connector 122, 124 may be mounted to the subsidiary circuit board 120. In the illustrated embodiment, the connectors 122, 124 are mounted to different sides 126, 128 of the subsidiary circuit board 120. The sides 126, 128 are opposite one another such that the connectors 122, 124 extend away from the subsidiary circuit board 120 in opposite directions.

The subsidiary circuit board 120 is positioned within the connector cage 106 between the top wall 108 and the main circuit board 104. The subsidiary circuit board 120 is disposed between the ports 116 along the vertical axis 132 of the connector assembly 102. The subsidiary circuit board 120 may be located between the ports 116 such that the connectors 122, 124 are aligned with different ports 116 and positioned to mate with the mating connectors (not shown) that are inserted or loaded into the ports 116 to electrically couple with the mating connectors.

An interposer assembly 134 is coupled with the subsidiary circuit board 120. The interposer assembly 134 may be mounted to and electrically coupled with the subsidiary circuit board 120. For example, the interposer assembly 134 may include signal contacts and ground contacts 200, 202 (shown in FIG. 2) having upper ends 322 (shown in FIG. 3) that mate with the subsidiary circuit board 120, and lower ends 324 (shown in FIG. 3) that mate with the main circuit board 104 when the connector assembly 102 is mounted to the main circuit board 104. The contacts 200, 202 of the interposer assembly 134 electrically couple the subsidiary circuit board 120 with the main circuit board 104. The mating connectors (not shown) that mate with the connectors 122, 124 may be electrically connected with the main circuit board 104 via the subsidiary circuit board 120 and the interposer assembly 134.

As described below, the interposer assembly 134 may arrange the signal and ground contacts 200, 202 (shown in FIG. 2) in a pattern that reduces or eliminates noise and/or crosstalk in signals communicated using the signal contacts 200. The signal and ground contacts 200, 202 may be arranged in the interposer assembly 134 to communicate data signals at relatively high data rates. By way of example only, the connector assembly 102 may be capable of communicating data signals through the interposer assembly 134 at data rates of at least approximately 10 Gigabytes per second. In another example, the data rate may be approximately 16 Gigabytes per second or greater.

A push block 136 is provided within the connector cage 106 between the subsidiary circuit board 120 and the connector cage 106. In the illustrated embodiment, the push block 136 is located on top of the side 126 of the subsidiary circuit board 120 between the side 126 and the top wall 108 of the connector cage 106. The push block 136 also is shown as being located behind the connector 122 between the connector 122 and the rear wall 112 of the connector cage 106 and between adjacent side walls 110, with one of the side walls 110 not shown in FIG. 1. The push block 136 transfers a loading force applied to the connector cage 106 to the interposer assembly 134 to seat the connector assembly 102 onto the main circuit board 104. For example, a loading force may be applied to the top wall 108 of the connector cage 106 in a direction generally along the longitudinal axis 132 and represented by the arrow 140 in FIG. 1. The loading force may be transferred to the subsidiary circuit board 120 by the push block 136. The loading force may force the subsidiary circuit board 120 and the interposer assembly 134 downward along the longitudinal axis 132 and toward the main circuit board 104. The loading force seats or loads the lower ends 324 (shown in FIG. 3) of the signal and ground contacts 200, 202 (shown in FIG. 2) of the interposer assembly 134 into corresponding contact openings 204, 206 (shown in FIG. 2) in the main circuit board 104. The lower ends 324 of the signal and ground contacts 200, 202 are forced into the contact openings 204, 206 to mount the connector assembly 102 to the main circuit board 104.

The push block 136 prevents the loading force from damaging or altering the structure of one or more components of the connector assembly 102. For example, the push block 136 may have a height dimension 142 (shown in FIG. 1) measured in along an axial direction that is oriented parallel to the vertical axis 132. The height dimension 142 of the push block 136 may be greater than a height dimension 144 (shown in FIG. 1) of the connector 122 measured in the same direction as the height dimension 142. The greater height dimension 142 of the push block 136 results in the loading force causing the connector cage 106 to contact and engage the push block 136 prior to or without engaging the connector 122. The push block 136 receives the loading force and prevents the connector cage 106 from bending downward and damaging or contacting the connector 122. In one embodiment, the height dimension 142 of the push block 136 is the greatest height dimension of all components and devices that are mounted or extending upward from the side 126 of the subsidiary circuit board 120.

Figure 3:
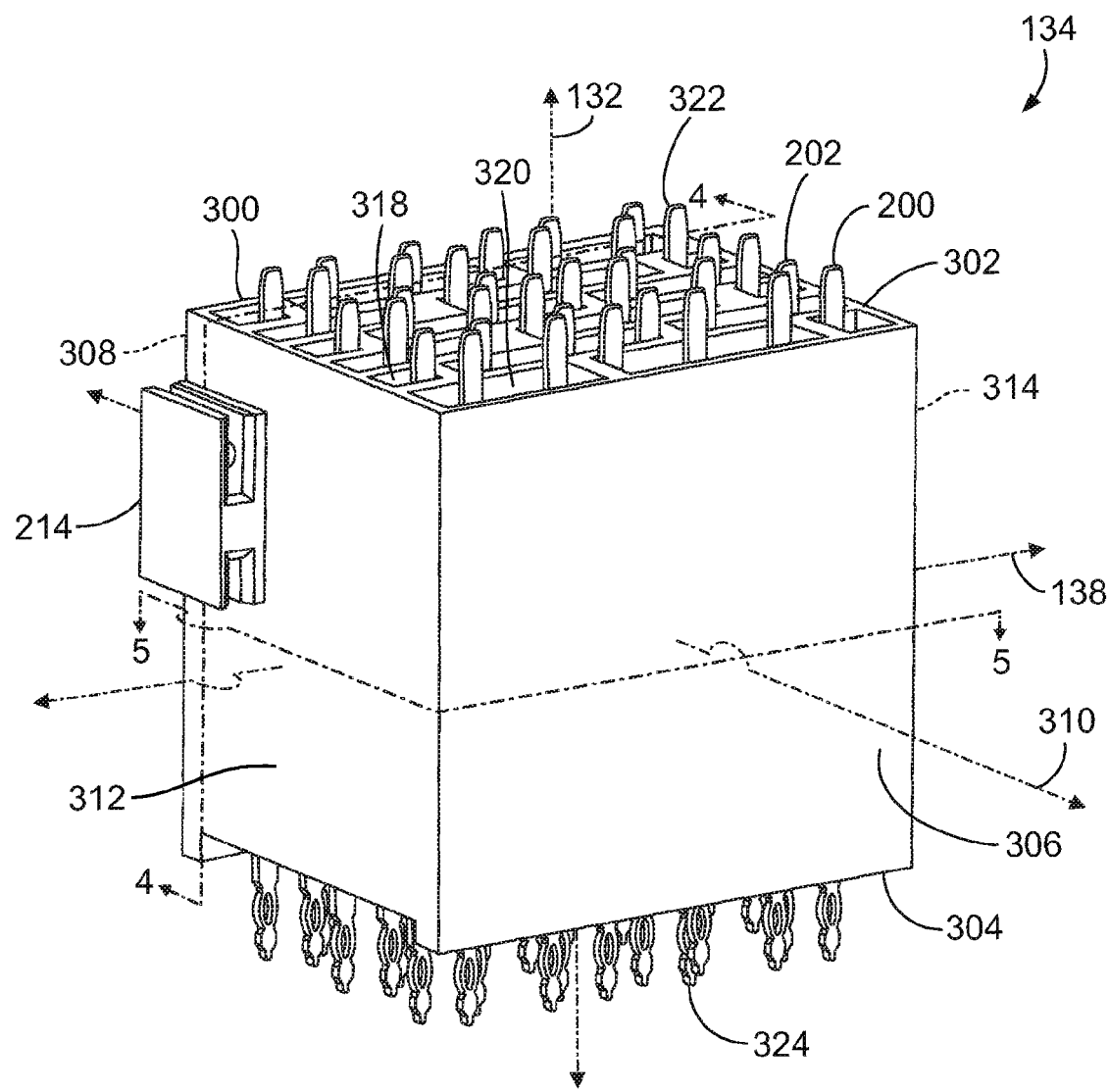
FIG. 3 is a perspective view of an interposer assembly shown in FIG. 1 in accordance with one embodiment of the presently disclosure.

FIG. 3 is a perspective view of the interposer assembly 134 in accordance with one embodiment of the present disclosure. The interposer assembly 134 includes a housing 300 that extends between a mating side 302 and an opposite mounting side 304 along the vertical axis 132, between opposite front and rear sides 306, 308 along a transverse axis 310, and between opposite sides 312, 314 along the lateral axis 138. In the embodiments illustrated in FIGS. 1-3, the vertical, lateral, and transverse axes 132, 138, 310 are disposed at right angles with respect to one another and intersect one another within the interposer assembly 134. In the embodiment shown in FIG. 1, the housing 300 extends between the subsidiary circuit board 120 (shown in FIG. 1) and the main circuit board 104 (shown in FIG. 1). For example, the side 302 of the interposer assembly 134 engages the side 128 (shown in FIG. 1) of the subsidiary circuit board 120 and the side 304 of the interposer assembly 134 engages the main circuit board 104 when the connector assembly 102 (shown in FIG. 1) is mounted to the main circuit board 104. The housing 300 includes, or is formed from, a dielectric material, such as one or more nonconductive polymers in one embodiment. For example, the housing 300 may be molded from one or more thermoplastic polymers.

The housing 300 includes the tab 214 projecting from the side 312 in a direction parallel to the lateral axis 138. Alternatively, the tab 214 may project from a different side 302, 304, 306, 308, 314 and/or in a different direction. The tab 214 may be received in the retention slot 210 (shown in FIG. 2) of the connector cage 106 (shown in FIG. 1) to secure the interposer assembly 134 to the connector cage 106. In one embodiment, prior to closing the rear side of the connector cage 106 with the rear wall 112 (shown in FIG. 1) by, for example, bending the rear wall 112 downward to enclose the rear side of the connector cage 106, the connector assembly 102 (shown in FIG. 1) may be loaded into the connector cage 106 through the rear side of the connector cage 106 by sliding the tab 214 into the retention slot 210. The engagement between the retention slot 210 and the tab 214 may limit or prevent movement of the connector cage 106 relative to the interposer assembly 134 and/or connector assembly 102 in one or more directions.

The housing 300 includes contact channels 318, 320 that extend from the side 302 toward the side 304. In one embodiment, the contact channels 318, 320 extend through the housing 300 from the side 302 to the side 304. As shown in FIG. 3, the contact channels 320 are wider in a direction along the lateral axis 138 than the contact channels 318 while the contact channels 318, 320 have approximately the same width in a direction along the transverse axis 310.

The signal and ground contacts 200, 202 are disposed within the contact channels 318, 320. The signal and ground contacts 200, 202 extend between an outer end 322 and a lower end 324 which may simply be termed opposite outer ends. The outer ends 322, 324 may differ from one another or be substantially the same. For example, in the embodiment shown in FIG. 3, the outer ends 322 of the signal and ground contacts 200, 202 differ from the outer ends 324 of the signal and ground contacts 200, 202. The outer ends 322 are loaded into or otherwise mate with the subsidiary circuit board 120 (shown in FIG. 1) while the outer ends 324 are loaded into or otherwise mate with the main circuit board 104 (shown in FIG. 1) to electrically couple the subsidiary circuit board 120 with the main circuit board 104. The illustrated outer ends 322 are solder tail contact ends that may be loaded into openings (not shown) in the subsidiary circuit board 120 (shown in FIG. 1) and soldered to the subsidiary circuit board 120. The illustrated outer ends 324 are eye-of-needle (EON) contact tails that may be press-fit into the contact openings 204, 206 (shown in FIG. 2) of the main circuit board 104 (shown in FIG. 1).

Figure 4:
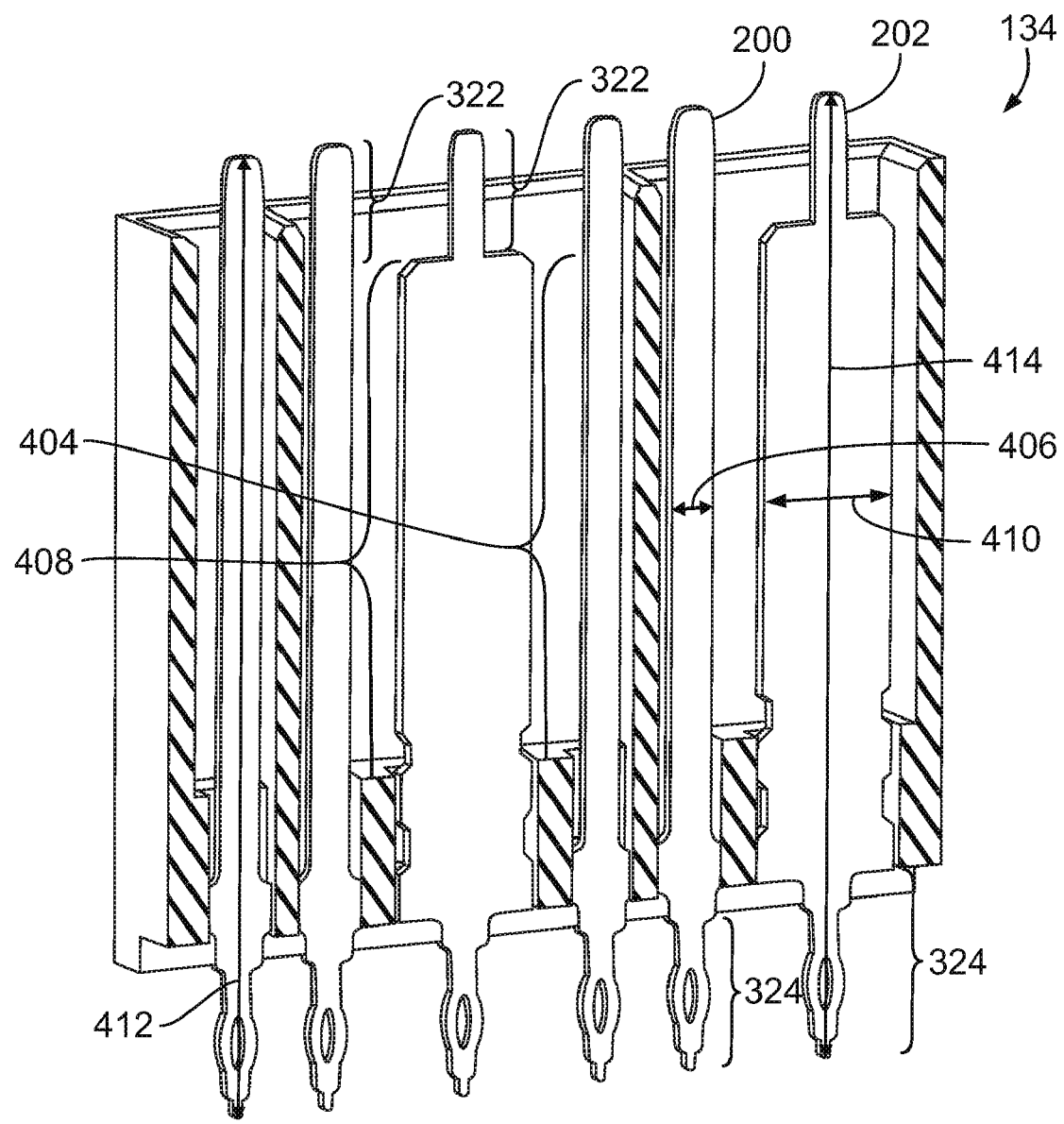
FIG. 4 is a cross-sectional view of the interposer assembly shown in FIG. 1 taken along line 4-4 in FIG. 3 in accordance with one embodiment of the present disclosure.

FIG. 4 is a cross-sectional view of the interposer assembly 134 taken along line 4-4 in FIG. 3 in accordance with one embodiment of the present disclosure. The tab 214 (shown in FIG. 2) is not shown in FIG. 4. The signal and ground contacts 200, 202 are elongated contacts oriented in directions along the longitudinal axis 132 (shown in FIG. 1). The signal and ground contacts 200, 202 have corresponding length dimensions 412, 414 that are measured between the tips of the outer ends 322, 324 in directions parallel to the longitudinal axis 132. The length dimensions 412, 414 may be approximately the same or may differ from one another.

The outer ends 322, 324 of the signal contacts 200 are interconnected by a body section 404. The body sections 404 of the signal contacts 200 have approximately constant width dimensions 406 in directions parallel to the lateral axis 138 in the illustrated embodiment. The outer ends 322, 324 of the ground contacts 202 are interconnected by a body section 408. The body sections 408 of the ground contacts 202 have approximately constant width dimensions 410 in directions parallel to the lateral axis 138 in the illustrated embodiment. The body sections 408 of the ground contacts 202 may have greater width dimensions 410 than the width dimensions 406 of the signal contacts 200.

The outer ends 322 include the portions of the signal and ground contacts 200, 202 that protrude from the body sections 404, 408 of the signal and ground contacts 200, 202. For example, the outer ends 322 of the signal and ground contacts 200, 202 may include the sections of the signal and ground contacts 200, 202 that have substantially identical dimensions and that protrude from one of the sides 302, 304, 306, 308, 312, 314 of the interposer assembly 134. Alternatively, the outer ends 322 of the signal and ground contacts 200, 202 may differ from one another. The outer ends 324 of the signal and ground contacts 200, 202 extend from the body sections 404, 408 in an opposite direction than the outer ends 202. As shown in FIG. 4, the outer ends 324 protrude from the side 304 of the interposer assembly 134. The outer ends 324 may be eye-of-needle pins that are inserted into the main circuit board 104 (shown in FIG. 1) to electrically couple the signal and ground contacts 200, 202 with the main circuit board 104. Alternatively, the outer ends 324 may have different dimensions and/or sizes.

Figure 5:
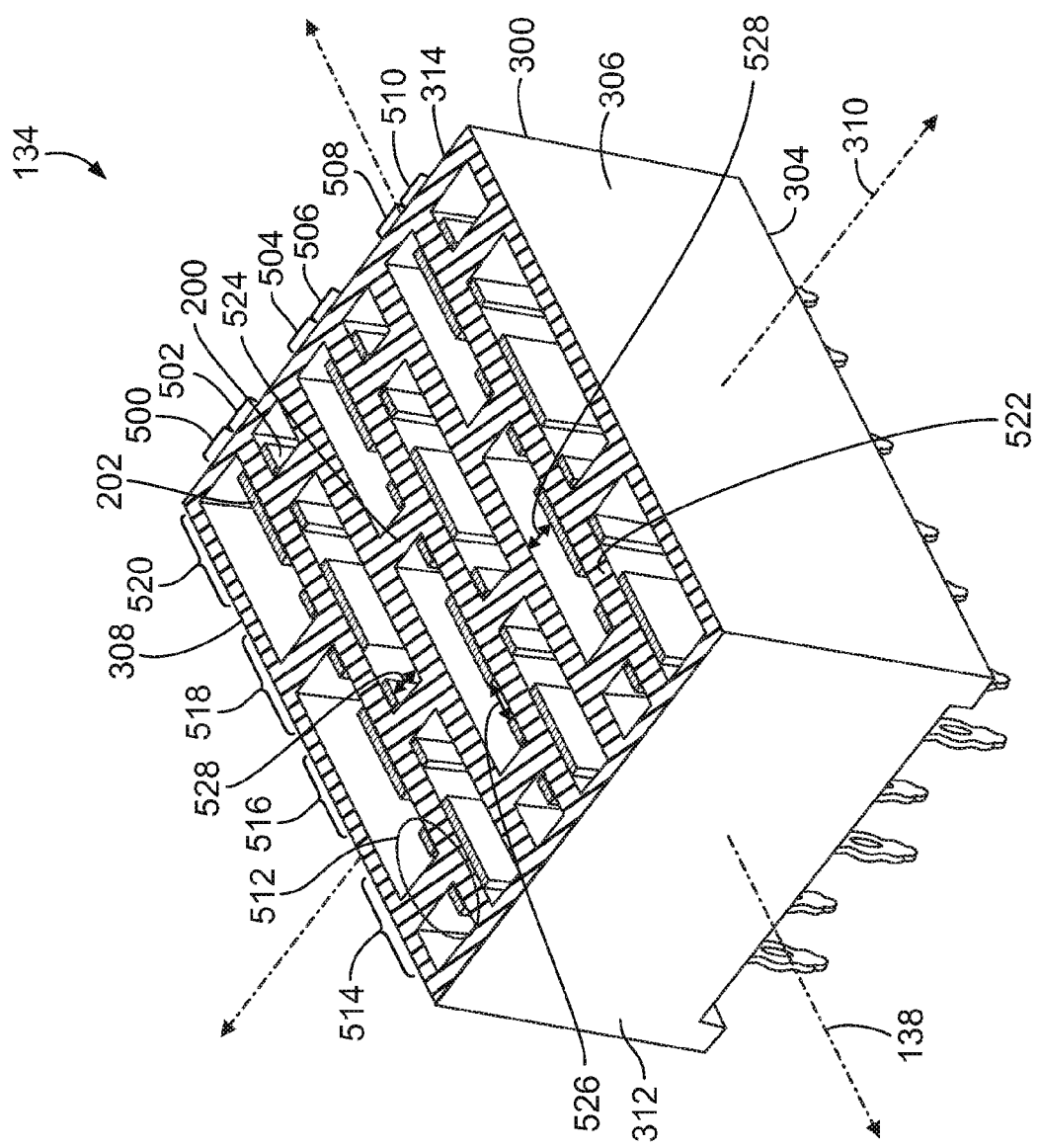
FIG. 5 is a cross-sectional view of the interposer assembly shown in FIG. 1 taken along line 5-5 shown in FIG. 3 in accordance with one embodiment of the present disclosure.

FIG. 5 is a cross-sectional view of the interposer assembly 134 taken along line 5-5 shown in FIG. 3 in accordance with one embodiment of the present disclosure. FIG. 5 illustrates the pattern, or spatial arrangement, of the signal and ground contacts 200, 202 relative to one another in a plane disposed parallel to the sides 302 (shown in FIG. 3) and 304 in one embodiment. The pattern shown in FIG. 5 includes several rows 500-510 of the contacts 200, 202. The rows 500-510 include sets or groups of the signal and ground contacts 200, 202 with the contacts 200, 202 linearly aligned with one another in directions oriented along the lateral axis 138. For example, the planar bodies 404, 408 (shown in FIG. 4) of the signal and ground contacts 200, 202 in each row 500-510 may be disposed in a common plane with one another, with the common plane oriented approximately parallel to the front and rear sides 306, 308 of the interposer assembly 134.

In each of the rows 500-510 shown in FIG. 5, the signal contacts 200 are arranged in several pairs 512, with two signal contacts 200 disposed adjacent to one another in each pair 512. A single one of the ground contacts 202 is located between adjacent pairs 512 of the signal contacts 200 in the rows 500-510. Alternatively, a different number of signal contacts 200 may be provided in groups along each row 500-510 instead of the signal contacts 200 being provided in the pairs 512. In another embodiment, a different number of ground contacts 202 may be provided between adjacent groups or pairs 512 of the signal contacts 200. The ground contacts 202 are separated from adjacent pairs 512 of the signal contacts 200 by a lateral air gap 526. The lateral air gap 526 may be a spatial separation between the ground contacts 202 and the signal contacts 200 in directions along the lateral axis 138 where no portion of the housing 300 or other component is disposed.

The signal and ground contacts 200, 202 also are arranged in several columns 514-520 in the pattern shown in FIG. 5. The columns 514-520 may be oriented along linear directions that are oriented perpendicular to the rows 500-510. For example, the columns 514-520 include several of the pairs 512 of the signal contacts 200 and several of the ground contacts 202 aligned with one another along directions that are parallel to the transverse axis 310. The bodies 404, 408 (shown in FIG. 4) of the signal and ground contacts 200, 202 in each column 514-520 are oriented in planes that are not common with one another. For example, the planar bodies 404, 408 of the signal and ground contacts 200, 202 in each column 514-520 may be oriented approximately parallel with respect to one another and approximately perpendicular to the linear direction over which each column 514-520 extends. Each column 514-520 includes pairs 512 of the signal contacts 200 that are separated from one another by a single one of the ground contacts 202. For example, the pairs 512 of the signal contacts 200 that are adjacent to one another in each column 514-520 are separated from one another by a single ground contact 202. Alternatively, a different number of the ground contacts 202 may be provided between adjacent pairs 512 of the signal contacts 200 along the columns 514-520. The signal and ground contacts 200, 202 may be arranged in the rows 500-510 and columns 514-520 such that an individual ground contact 202 separates adjacent pairs 512 of the signal contacts 200 along the rows 500-510 and a different individual ground contact 202 separates adjacent pairs 512 of the signal contacts 200 along the columns 514-520.

The housing 300 of the interposer assembly 134 includes lateral interior walls 522 that extend between the opposite sides 312, 314. The lateral interior walls 522 are oriented approximately parallel to one another and to the front and rear sides 306, 308 of the interposer assembly 134. As shown in FIG. 5, the lateral interior walls 522 are oriented parallel to the lateral axis 138. The lateral interior walls 522 may extend from the mating side 302 (shown in FIG. 3) to the mounting side 304 of the housing 300. The lateral interior walls 522 separate the rows 500-510 of the contacts 200, 202 from one another. For example, each lateral interior wall 522 may separate adjacent rows 500-510 of the signal and ground contacts 200, 202 from each other. As shown in FIG. 5, the contacts 200, 202 in adjacent rows 500-510 abut opposite sides of the lateral interior walls 522. For example, the signal and ground contacts 200, 202 in the row 500 and the signal and ground contacts 200, 202 in the row 502 abut the opposite sides of the lateral interior wall 522 that separates the rows 500, 502 from one another. The lateral interior walls 522 separate the ground contacts 202 from the pairs 512 of the signal contacts 200 within the columns 514-520. For example, the ground contacts 202 are separated from adjacent ones of the pairs 512 of the signal contacts 200 by the lateral interior walls 522 within each of the columns 514-520. The signal and/or ground contacts 200, 202 may be separated from an adjacent lateral interior wall 522 by a transverse air gap 528. The transverse air gap 528 is a spatial separation between a signal and/or ground contact 200, 202 and a lateral interior wall 522 in a direction along the transverse axis 310. In one embodiment, no portion of the housing 300 or any other component is provided in the transverse air gap 528.

The housing 300 shown in FIG. 5 includes transverse interior walls 524 that extend between the lateral interior walls 522. For example, the transverse interior walls 524 couple adjacent ones of the lateral interior walls 522 with one another. The transverse interior walls 524 are oriented approximately parallel to one another and to the opposite sides 312, 314 of the housing 300. As shown in FIG. 5, the transverse interior walls 524 also are oriented parallel to the transverse axis 310. The transverse interior walls 524 may extend from the mating side 302 (shown in FIG. 3) to the mounting side 304 of the housing 300. The transverse interior walls 524 are portions of the housing 300 that separate the signal contacts 200 from one another in the groups or sets of signal contacts 200. For example, the transverse interior walls 524 separate the signal contacts 200 in the pairs 512 of signal contacts 200 from one another. As shown in FIG. 5, the signal contacts 200 on opposite sides of the transverse interior walls 524 abut the opposite sides of the transverse interior walls 524. Alternatively, an air gap or separation gap may exist between the signal contacts 200 and the transverse interior walls 524.

The location or arrangement of the signal contacts 200, ground contacts 202 and one or more portions of the housing 300 may reduce cross-talk and/or electromagnetic interference in the interposer assembly 134. For example, the lateral interior walls 522 located between the ground contacts 202 and adjacent pairs 512 of the signal contacts 200 in directions parallel to the transverse axis 310 may increase the coupling between the signal and ground contacts 200, 202. The coupling between the signal and ground contacts 200, 202 may be energy coupling, capacitive coupling, and/or inductive coupling. Increasing the coupling between the signal and ground contacts 200, 202 using the dielectric lateral interior walls 522 may increase an electric impedance characteristic of the interposer assembly 134. For example, increasing the coupling between the contacts 200, 202 via the lateral interior walls 522 may increase an electric capacitive characteristic of the interposer assembly 134. As a result, cross-talk between the signal contacts 200 may be reduced. Providing ground contacts 202 between the pairs 512 of signal contacts 200 in directions parallel to the lateral axis 138 may reduce electromagnetic interference in the interposer assembly 134. For example, the ground contacts 202 may be coupled with an electric ground reference of the main circuit board 104 (shown in FIG. 1) to transfer electromagnetic interference in the interposer assembly 134 to the ground reference.

Figure 6:
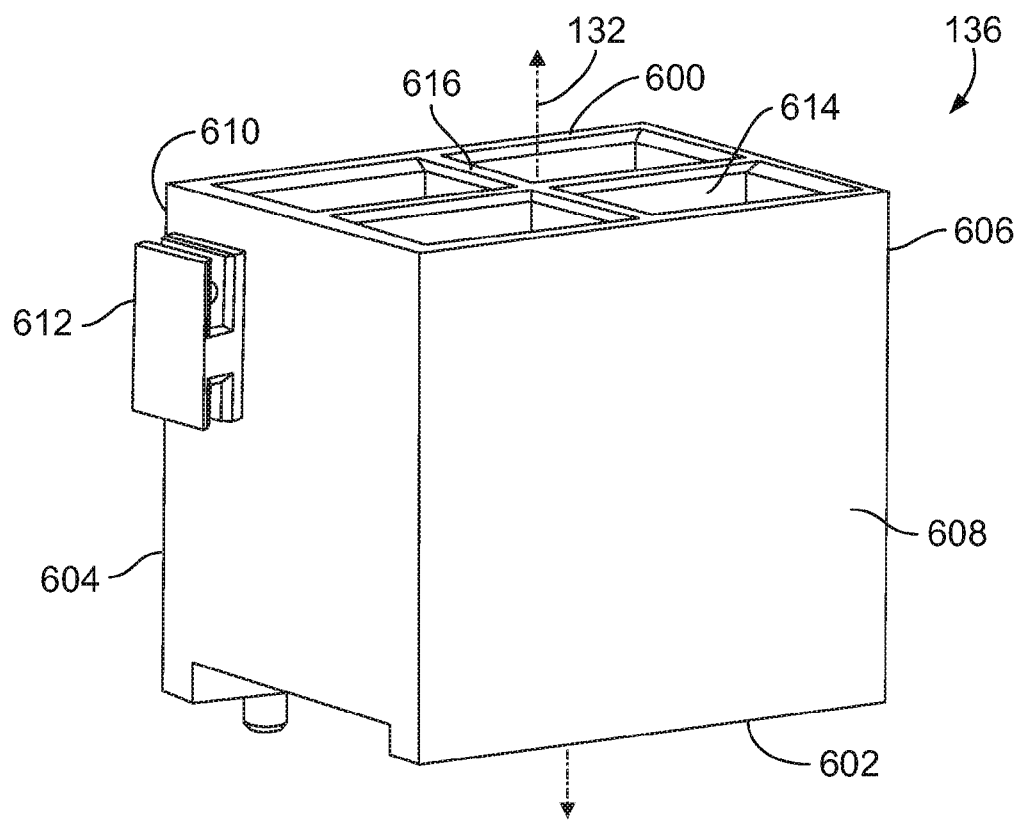
FIG. 6 is a perspective view of a push block shown in FIG. 1 in accordance with one embodiment of the present disclosure.
Figure 7:
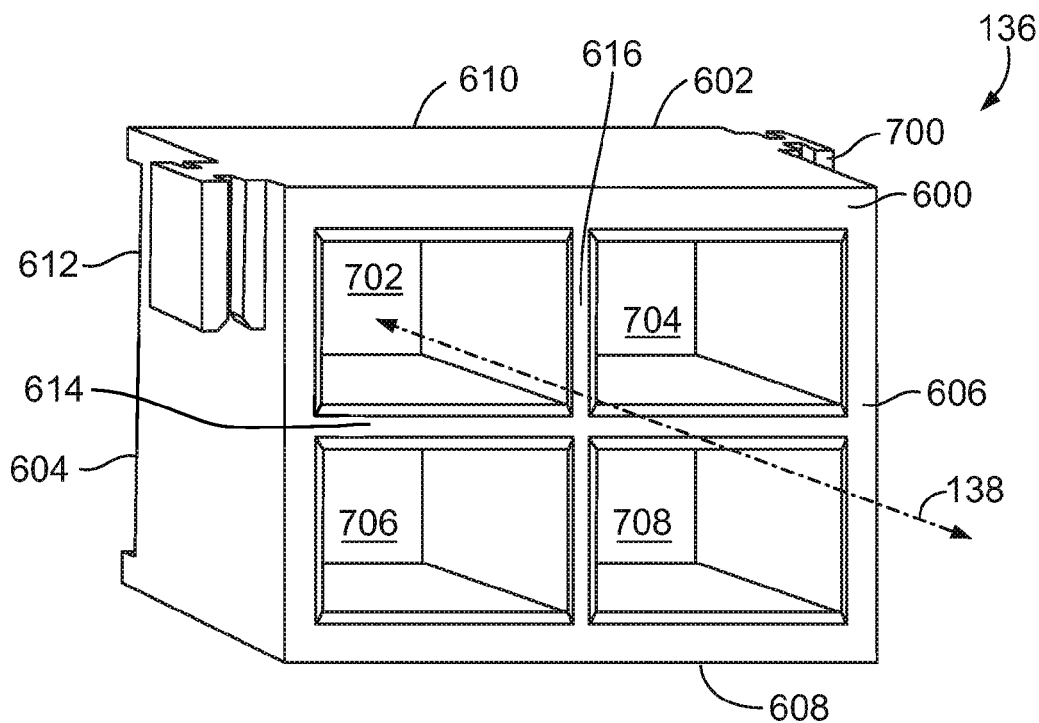
FIG. 7 is another perspective view of the push block shown in FIG. 1 in accordance with one embodiment of the present disclosure.

FIG. 6 is a perspective view of the push block 136 in accordance with one embodiment of the present disclosure. FIG. 7 is another perspective view of the push block 136 in accordance with one embodiment of the present disclosure. The push block 136 may include, or be formed from, a dielectric material. For example, the push block 136 may be molded from one or more polymers. Alternatively, the push block 136 may include, or be formed from, a conductive material, such as a metal or metal alloy. The push block 136 extends between opposite top and bottom sides 600, 602 in a direction along the vertical axis 132, between opposite sides 604, 606 in a direction parallel to the lateral axis 138 (shown in FIG. 1), and between opposite front and rear sides 608, 610 in a direction parallel to the transverse axis 310 (shown in FIG. 3)

The push block 136 includes tabs 612, 700 (shown in FIG. 7) that protrude from the sides 604, 606. One or more of the tabs 612, 700 may be received in retention slots 208 (shown in FIG. 2) in the connector cage 106 (shown in FIG. 1) to secure the push block 136 to the connector cage 106. For example, the tab 612 may be slid into the retention slot 208 and the tab 700 may be slid into a similar retention slot (not shown) in one of the side walls 110 (shown in FIG. 1).

The push block 136 includes crossing interior walls 614, 616. The interior wall 614 is oriented approximately parallel to the vertical and lateral axes 132, 138 (shown in FIG. 1) and the interior wall 616 is oriented approximately parallel to the vertical and transverse axes 132, 310 (shown in FIG. 3). The interior wall 614 extends between the sides 604, 606 and from the top side 600 to the bottom side 602. The interior wall 616 extends between the front and rear sides 608, 610 and from the top side 600 to the bottom side 602. The interior walls 614, 616 intersect one another within the interior of the push block 136. In the illustrated embodiment, the interior walls 614, 616 define four channels 702-708 that extend through the push block 136 from the top side 600 to the bottom side 602. Alternatively, a different number of interior walls 614, 616 and/or interior channels 702-708 may be provided.

The interior walls 614, 616 and/or the sides 604-610 receive the loading force applied along the direction of the arrow 140 (shown in FIG. 1) at the top side 600 and transfer this force to the bottom side 602 of the push block 136. The loading force is transferred to the subsidiary circuit board 120 (shown in FIG. 1) to push the contacts 200, 202 (shown in FIG. 2) into the main circuit board 104 (shown in FIG. 1) to seat the contacts 200, 202 in the main circuit board 104, as described above.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and merely are example embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A connector assembly comprising:
a subsidiary circuit board including opposite sides;
connectors mounted to the opposite sides of the subsidiary circuit board, the connectors electrically coupled with the subsidiary circuit board and configured to mate with mating connectors; and
an interposer assembly joined with the subsidiary circuit board, the interposer assembly including a dielectric housing and elongated signal and ground contacts extending between opposite outer ends along a vertical axis and held by the housing, the signal contacts arranged in pairs with the pairs and the ground contacts disposed on opposite sides of lateral interior walls of the housing and the signal contacts in the pairs separated from each other by transverse interior walls of the housing, wherein the interposer assembly mates with the subsidiary circuit board and is configured to mate with a main circuit board such that the outer ends of the contacts electrically couple the connectors mounted to the subsidiary circuit board with the main circuit board.

2. The connector assembly of claim 1, wherein the pairs of the signal contacts that are adjacent to one another along a lateral axis of the interposer assembly are separated from one another by a single ground contact.

3. The connector assembly of claim 1, wherein the pairs of signal contacts that are adjacent to one another along a transverse axis of the interposer assembly are separated from one another by a single ground contact, the pairs of signal contacts that are adjacent to one another along a lateral axis of the interposer assembly separated from one another by a different single ground contact.

4. The connector assembly of claim 1, wherein the signal contacts within each of the pairs of signal contacts are separated from one another by a the transverse interior walls of the housing along a transverse axis of the interposer assembly and the pairs of signal contacts are separated from the ground contacts by gaps along a lateral axis of the interposer assembly.

5. The connector assembly of claim 1, wherein the signal contacts are separated from the ground contacts by an air gap along a lateral axis of the interposer assembly and separated from the ground contacts by the lateral interior walls of the housing along the transverse axis of the interposer assembly.

6. The connector assembly of claim 1, further comprising a connector cage configured to be mounted to the main circuit board, the connector cage comprising ports adapted to receive the mating connectors, wherein the subsidiary circuit board, the connectors mounted to the subsidiary circuit board, and the interposer assembly are disposed within the connector cage such that the connectors mounted to the subsidiary circuit board mate with the mating connectors loaded into the ports.

7. The connector assembly of claim 6, further comprising a push block disposed within the connector cage between the subsidiary circuit board and the connector cage, the push block receiving a loading force applied to the connector cage and transferring the loading force to the contacts of the interposer assembly to mate the contacts with the main circuit board.

8. The connector assembly of claim 1, wherein the contacts in the interposer assembly electrically couple to the connectors mounted to the subsidiary circuit board and the mating connectors with the main circuit board via the subsidiary circuit board.

9. The connector assembly of claim 1, wherein at least one of the connectors is mounted to one of the opposite sides of the subsidiary circuit board and at least one other of the connectors is mounted to the other of the opposite sides of the subsidiary circuit board.

10. The connector assembly of claim 1, wherein the housing of the interposer assembly extends between a mating side and a mounting side, the mating side engaging the subsidiary circuit board, the mounting side engaging the main circuit board when the interposer mates with the main circuit board.

11. The connector assembly of claim 1, wherein the contacts in the interposer assembly are elongated contacts that mate with and extend between the subsidiary circuit board and the main circuit board when the interposer assembly mates with the main circuit board.

12. A connector assembly comprising:
- a connector cage including a port that is configured to receive a mating connector into the connector cage, the connector cage adapted to be mounted to a main circuit board;
- a subsidiary circuit board disposed within the connector cage between the ports;
- a connector mounted to and electrically coupled with the subsidiary circuit board, the connector disposed within the port of the connector cage and configured to mate with the mating connector to electrically couple the mating connector with the subsidiary circuit board;
- an interposer assembly mounted to the subsidiary circuit board and configured to mate with the main circuit board, the interposer assembly comprising contacts that are configured to mate with and electrically couple the subsidiary circuit board with the main circuit board, the contacts including a ground contact and pairs of signal contacts, the signal contacts within each of the pairs separated from each other by a portion of the housing and separated from the ground contact by an air gap along a lateral axis of the interposer assembly; and
- a push block disposed between the subsidiary circuit board and the connector cage, the push block receiving a loading force applied to the connector cage and transferring the loading force to the interposer assembly to mate the interposer assembly with the main circuit board.

13. The connector assembly of claim 12, wherein the connector cage includes a top wall, a rear wall, and opposing side walls joined with one another, the push block disposed between the subsidiary circuit board and the top wall, between the side walls, and between the connector mounted to the subsidiary circuit board and the rear wall.

14. The connector assembly of claim 12, wherein the push block includes a tab that engages the connector cage and secures the push block to the connector cage.

15. The connector assembly of claim 12, wherein the push block and the connector are mounted to a common side of the subsidiary circuit board, the push block having a height dimension along a vertical axis between the subsidiary circuit board and the connector cage that is larger than a height dimension of the connector mounted to the subsidiary circuit board.

16. The connector assembly of claim 12, wherein the pairs of signal contacts that are adjacent to one another along the lateral axis of the interposer assembly are separated from one another by a single ground contact.

17. The connector assembly of claim 12, wherein the pairs of signal contacts that are adjacent to one another along a transverse axis of the interposer assembly separated from one another by a single ground contact, the pairs of signal contacts that are adjacent to one another along the lateral axis of the interposer assembly separated from one another by a different single ground contact.

18. The connector assembly of claim 12, wherein the signal contacts are separated from the ground contact by the housing along a transverse axis of the interposer assembly.

19. The connector assembly of claim 12, wherein the connector is mounted to a first side of the subsidiary circuit board and another connector is mounted to an opposite second side of the subsidiary circuit board.

20. A connector assembly comprising:
- a subsidiary circuit board including opposite sides;
- connectors mounted to the opposite sides of the subsidiary circuit board, the connectors electrically coupled with the subsidiary circuit board and configured to mate with mating connectors;
- an interposer assembly joined with the subsidiary circuit board, the interposer assembly including a dielectric housing; and
- elongated contacts disposed in the housing of the interposer assembly, the contacts extending between opposite outer ends, the contacts including ground contacts and pairs of signal contacts, the signal contacts separated from the ground contacts by an air gap along a first axis of the interposer assembly and separated from the ground contacts by the housing along a second axis of the interposer assembly, wherein the interposer assembly mates with the subsidiary circuit board and is configured to mate with a main circuit board such that the outer ends of the contacts electrically couple the connectors mounted to the subsidiary circuit board with the main circuit board.

21. The connector assembly of claim 20, wherein the signal contacts within each of the pairs of signal contact are separated from one another by the housing.

22. The connector assembly of claim 20, further comprising a connector cage having a port configured to receive a mating connector that mates with at least one of the connectors and a push block disposed between the subsidiary circuit board and the connector cage, the push block including a tab that engages the connector cage and secures the push block to the connector cage, wherein the push block is positioned within the connector cage to receive a loading force applied to the connector cage and transfer the loading force to the interposer assembly.

* * * * *